United States Patent [19]

Hood et al.

[11] 4,021,278

[45] May 3, 1977

[54] REDUCED MENISCUS-CONTAINED METHOD OF HANDLING FLUIDS IN THE MANUFACTURE OF SEMICONDUCTOR WAFERS

[75] Inventors: Roderick Kermit Hood, Williston; Karl Heinz Raacke, Essex Junction, both of Vt.

[73] Assignee: International Business Machines Corporation, Armonk, N.Y.

[22] Filed: Dec. 12, 1975

[21] Appl. No.: 640,118

[52] U.S. Cl. .............................. 156/626; 156/345; 156/636; 156/659; 269/21
[51] Int. Cl.² ........................................ H01L 21/68
[58] Field of Search ................ 156/8, 13, 17, 345; 96/36, 35; 269/21

[56] References Cited

UNITED STATES PATENTS

| | | | |
|---|---|---|---|
| 2,701,191 | 2/1955 | Laliberte | 106/3 |
| 2,978,804 | 4/1961 | Soper et al. | 156/17 |
| 3,437,543 | 8/1969 | Winings | 156/345 |
| 3,549,439 | 12/1970 | Kaueggia et al. | 156/345 |
| 3,953,265 | 4/1976 | Hood | 156/8 |

*Primary Examiner*—Charles E. Van Horn
*Assistant Examiner*—Jerome W. Massie
*Attorney, Agent, or Firm*—Stephen J. Limanek

[57] ABSTRACT

The invention relates to a method for reducing the consumption of deleterious materials used in the manufacture of semiconductor devices comprising the steps of supporting a semiconductor wafer, supplying a predetermined volume of said materials onto the surface of said wafer to form a meniscus contained body of said materials less than the normal meniscus formed by the particular material, maintaining said wafer in a static condition during the desired reaction period, sensing the completion of said reaction and spinning said wafer upon completion of said reaction to remove reaction products and terminate the reaction.

Accordingly, this invention is directed at significantly reducing the initial cost of the processing fluids and the large investment and maintenance costs needed to provide the means for recovering precious materials in the fluid waste, and for the environmental disposal of corrosive waste materials resulting from the use of the fluids in integrated circuit manufacture.

13 Claims, 6 Drawing Figures

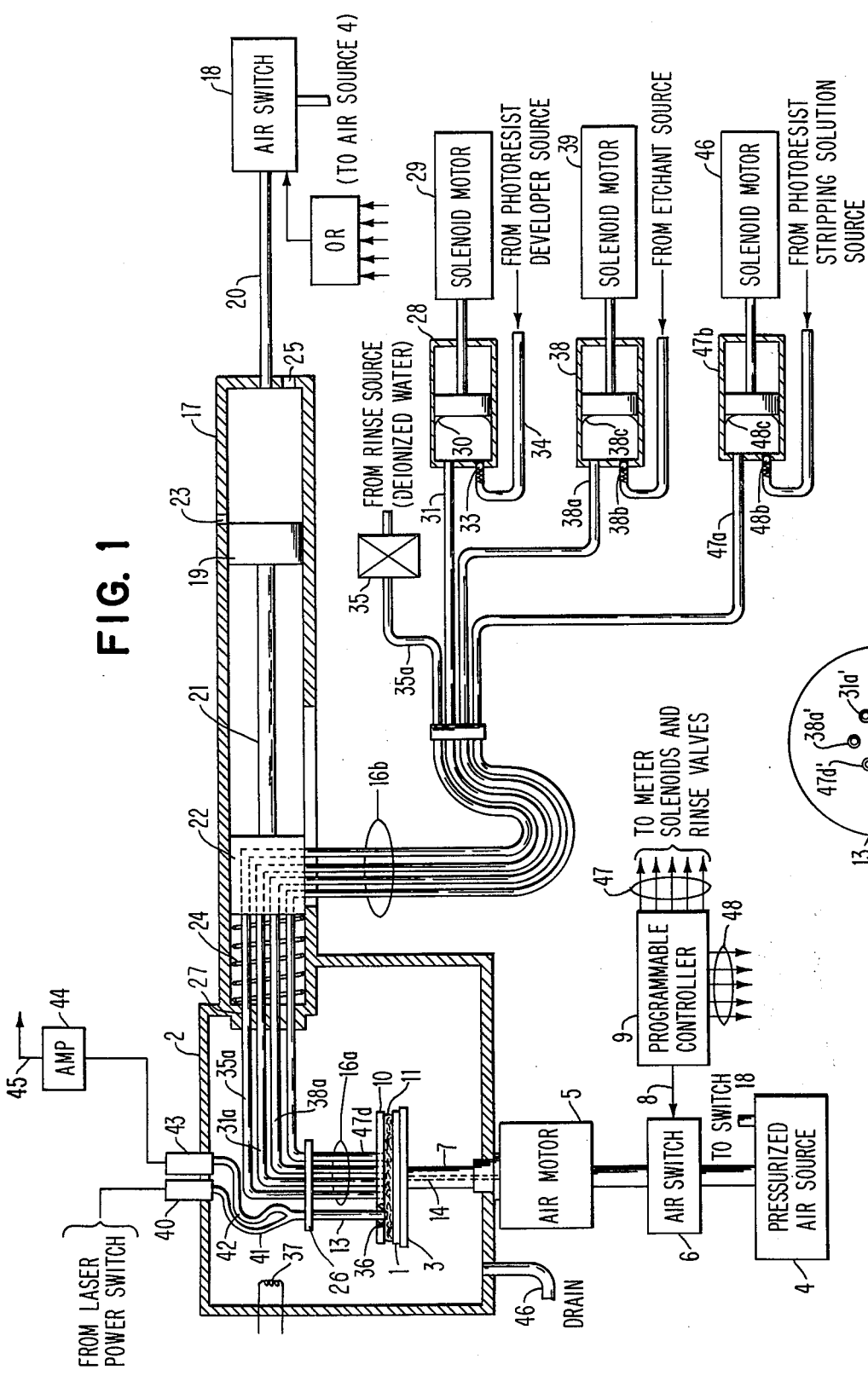

REDUCED MENISCUS-CONTAINED METHOD OF HANDLING FLUIDS IN THE MANUFACTURE OF SEMICONDUCTOR WAFERS

BACKGROUND OF THE INVENTION

This invention relates generally to methods for reducing the consumption of environmentally damaging fluids used in manufacturing integrated semiconductor circuits contained on wafers without any corresponding reduction in quantity or quality of production and is an improvement over commonly assigned U.S. applicaton Ser. No. 572,570, filed on Apr. 28, 1975, by R. K. Wood and titled "Meniscus-Contained Method of Handling Fluids In The Manufacture Of Semiconductor Wafers", Now U.S. Pat. No. 3,953,265.

The present invention provides a novel method of handling corrosive and other fluids which provides significant environmental, engineering, and economic advantages over prior methods of fluid handling during the manufacture of semiconductor devices commonly known as integrated circuits or large scale integration (LSI). The fluids used in the manufacture of integrated circuit structures includes among other things etchants, photolithography solvents as well as a host of other chemicals of organic and inorganic nature which are not only environmentally damaging but very costly and, therefore, effect the manufacturing cost of the product.

DESCRIPTION OF THE PRIOR ART

Many different techniques have been developed in the prior art of handling fluids used in the manufacture of semiconductor wafers. Prior techniques generally handled the fluid in the tank, handled it as a spray, or handled it by evaporation. For example, the wafer etching step generally involved immersing a wafer into a bath of hydrofluoric acid etchant, or spraying the etchant, or evaporating the etchant fluid.

Each of these handling methods involves the use of excessive amounts of fluid and can impact the quickness with which the fluids effect on the wafer can be terminated, which can be critical in some manufacturing steps, such as etching, For example, one or more seconds may expire while a wafer is being removed from an immersion bath, which can cause overetching that may ruin the wafer.

Normally more than one wafer is etched in a bath of etchant, which allows some wafers to underetch and some to overetch as oxide thickness varies from wafer to wafer. This invention allows wafers to be etched one at a time to overcome this problem.

Futhermore, the method of handling the fluid can effect contaminants in the fluid, which can destroy a wafer during a manufacturing step. For example, in order to prevent contamination of the delicate wafer surface during the immersion etching step, prior techniques generally required a total replacement of the etchant bath with each new wafer layer to be etched.

Similarly, the prior immersion and spray handling techniques were wasteful in other manufacturing steps, such as photoresist developing and stripping, by causing the use of excessive amounts of photoresist developer and photoresist stripper.

The etching and other manufacturing steps required the disposal of large quantities of very corrosive fluids, such as hydrofluoric acid (HF), sulfuric acid ($H_2SO_4$), and other environmentally destructive fluids, which needed to be specially handled for disposal by expensive disposal means.

Furthermore, significant amounts of precious metal, such as gold, platinum, and iridium are dissolved by the etching operation at various steps in the wafer layer manufacturing process. The waste fluids are recycled to recover these precious metals. Hence, a reduction in the amount of waste fluids reduces the recycling recovery costs.

SUMMARY OF THE INVENTION

The subject invention has particular application in the handling of the corrosive materials needed for photoresist developing, etching and stripping operations, while maintaining high standards of both quality and quantity of production in processing semiconductor wafers. It has been found that the corrosive materials used in these operations, such as hydrofluoric acid, sulfuric acid, potassium hydroxide, as well as organic solvents, etc., can be reduced to more than 90% of their former quantities through the use of the subject invention, while obtaining improved production goals. For example, the subject invention has been found to handle the required etching of a resist-defined layer on a three and one-fourth inch diameter semiconductor wafer using as little as 2 cc (cubic centimeters) of buffered HF etch solution to provide a fluid thickness of 2.2 millimeters; while the prior immersion etching process averaged 150 cubic centimeters of the same etch fluid per wafer of the same size. The same relative saving was found in the use of the stripping solution, and of resist developer solution.

This invention provides the best match found to date in the quantity of etchant in relation to the amount, speed, and quality and quantity of the etched result.

The subject invention includes the discovery that a minimized meniscus contained body of etchant fluid or other fluids or mixtures thereof provides excellent control for forming resist masked surface of semiconductor wafers. This minimized meniscus reaction fluid is accomplished by providing a means for decreasing the space height over the wafer to be treated in which a normal meniscus body would form upon the application of a fluid reactant.

Experiments have shown that precision and uniformity of etched line depth and width across the wafer surface equal or exceed the best precision and uniformity found with dip etching processes which uses over 75 times the amount of fluid used by the invention and which require more processing stations for the wafer during integrated circuit manufacturing. No adverse side-effects have been noted in the processing using this invention such as due to lack of agitation of the fluids including the absence of any problems from clinging air bells on the wafer surface which prior etching theories might expect.

A resultant feature of this invention is that it also enables high through-put in semiconductor device manufacturing by enabling greater efficiency in semiconductor manufacturing processes and flexibility in equipment design. In particular, the invention enables the consolidation of several different steps of the manufacturing process to single manufacturing location, where previously a wafer had to be moved to several different locations for the same steps, resulting in slower manufacturing and greater manufacturing time, equipment, and building. Thus, the inventions ability to perform more processing steps while the wafer is at a single location can significantly increase the throughput of semiconductor integrated circuit manufacturing.

It is, therefore, a primary object of this invention to provide a new method of handling operating fluids which process a wafer surface during the manufacture of electronic semiconductor circuits to greatly reduce the amount of operating fluids needed.

It is another object of this invention to provide a novel process which improves etching quality by providing a more precise termination of an etching operation than any prior etching process. The invention enables the very fast application of centrifugal force or static rinse to provide precise termination of an etching operation when compared to the slow termination in the prior immersion or an evaporation etching methods.

It is also an object of the subject invention to provide an etching and photolithography method which enables the accurate use of light reflecting or other types of the etching and other end-point detection means. The invention permits the most sensitive end-of-etch detection means to be used, and permits very fast etch termination response to an end signal from the etch-endpoint detection means. The etching time is very critical with many types of layers on a semiconductor wafer, because the layer thinness is generally measured in Angstroms (A), and a slight amount of overetching time can ruin the layer by cutting away too much layer material. The etching step has been ended by a timed period, and more recently by etchant end point detectors.

Still another object of this invention is to provide a processing method which enables significant simplification flexibility in the tools needed to perform the sequence of resist development, etching, and resist stripping steps, compared to tools needed by prior etching techniques. This tool simplification is an addition to the advantage of requiring very small amounts of operating fluids. This reduction also includes the size of tanks required to store development, etching, and stripping fluids, an avoidance of recirculation equipment for reprocessing used fluids, and a great reduction in waste processing equipment as well as enhance the safety aspect of the processing tool.

The subject invention enables single location processing for a wafer by permitting more steps to be performed at a single location in the semiconductor wafer manufacturing operation than is found in prior manufacturing processes for making semiconductor circuits, such as the steps of resist stripping after etching, and washing and drying the wafer in preparation for the steps of adding the next layer to the wafer surface, and repeating these steps for each deposited layer in the overall process until the manufacturing is completed for a semiconductor integrated circuit wafer. Accordingly, the invention is particularly adaptable to the automated production of semiconductor circuits, and can easily accomodate wafers of different sizes by changing the metering of the quantity of fluids provided at the required steps in the operation.

The invention can, therefore, reduce the amount of transportation needed for a wafer during the integrated circuit manufacturing process compared to the transportation requirements in current manufacturing processes, since the invention permits a sub-grouping of steps at a single location, where prior processing required wafer transportation between multiple locations for this subgroup of steps.

The invention also eliminates a need for backside protection for a wafer being etched or stripped (as is currently required by immersion or evaporation process) since the backside of the wafer is not exposed to the etching or stripping fluids during use of the invention.

The primary feature of this invention is in the discovery that, in particular, the successful etching or other liquid processing steps can be done by a lesser than normal amount of static fluid held by surface tension or otherwise forming a meniscus boundary around a body of fluid provided to the edges of the upper surface of a supported semiconductor wafer. This lesser than normal meniscus contained fluid body for any reactant or mixture thereof is formed by supplying a means for reducing the space height normally required by a specific fluid to form said meniscus contained fluid body upon addition of fluid to the wafer surface to be treated by chemical reaction. It has, therefore, been found that chemical action can be undertaken without the agitation previously thought essential for gas bubble removal on the etching of precision microscopic surfaces. The meniscus boundary is aided by the sharp edges of a water, which react with the fluid surface tension to allow a wide tolerance in the volume of the fluids that may be poured onto the wafer surface for wetting the entire upper surface and yet not overflowing the wafer edges. The meniscus contained body, for example, has been found to meet these requirements with as little as 12 and as much as 22 cubic centimeters of buffered HF etchant on a three and ¼ inch diameter wafer without overflowing the wafer edge yet covering the entire upper wafer surface to its edges for all volumes between these limits. Wetting agents have been found to affect the volume limits when using this invention. Although th concept described herein is applicable to one side of a semiconductor wafer, the same height limiting means can be applied to top and bottom of a tool simultaneously or separately.

The detailed embodiment of the invention process places the wafer on a supported rotatable table, such as provided by a centrifugal or vacuum chuck, and performs the meniscus controlled development, etching and stripping steps while the wafer is statically held non-rotationally by chuck. After the meniscus contained fluid is applied and at the instant its use is sensed to be complete, the meniscus bound fluid is rapidly removed from the wafer by suddenly rotating the table with the wafer by energizing a motor, so that centrifugal force rapidly breaks the meniscus and removes the liquid from the wafer surface. Whether spinning or stationary, water or other rinse liquids may be squirted or sprayed on the wafer to wash it.

In this manner, a summary listing of static and rotational steps which may be performed on a semiconductor wafer at a single manufacturing location are:
1. Photoresist development with meniscus contained body (static).
2. Stop development and rinse (rotational).
3. Dry (rotational).
4. Bake (static).
5. Etch with meniscus contained body (static).
6. Stop etch and rinse (rotational).
7. Strip the resist with meniscus contained body (static).
8. Stop strip and rinse (rotational).
9. Dry (rotational).

The static spindle method of minimized meniscus contained etching or other processing steps accomplished by this invention has been successfully accomplished on many different types of layers deposited on a silicon wafer, such as oxide and polysilicon surfaces, doped oxide, polysilicon nitride, thin oxide, thick oxide, aluminum, and sputtered quartz.

The foregoing and other objects, features and advantages of the invention will be more apparent from the following more particular description of the preferred embodiment of the invention illustrated in the accompanying drawings.

BRIEF DESCRIPTION OF THE DRAWINGS

FIG. 1 shows schematically a processing station wherein is a preferred embodiment of this invention.

FIG. 2 is a top view of a fluid limiting means and illustrating processing fluid tubes entering through the top meniscus limiting means in the preferred embodiment.

DETAILED EMBODIMENT

Figure 3:
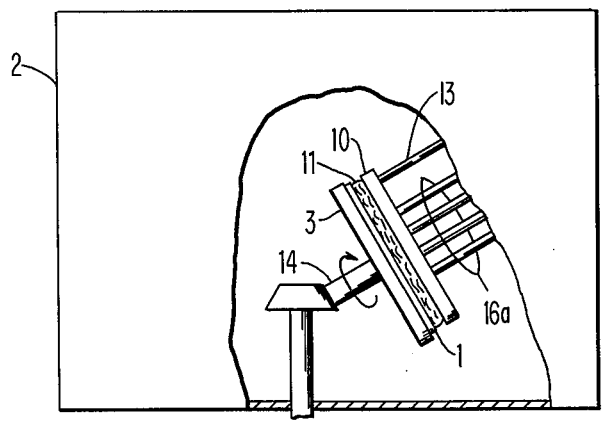
FIG. 3 is a view similar to FIG. 2 wherein the wafer is attached to a rotatable spindle in an angular position.

The invention is based on the use of a means for forming a less than normal meniscus contained fluid bodies applied to the surface of a stationary semiconductor wafer either having a developed or undeveloped photoresist overlay or other material thereon during integrated circuit manufacture. The wafer is positioned and secured in practically any configuration on a rotatable means during the use of the static minimized meniscus contained fluid body. There are a number of important parameters involved in minimizing the amount of fluid materials in a meniscus contained body involved, for example, in the steps of photoresist developing, acid etching, and alkali stripping. The parameters include temperature, specific fluid surface tension properties, and proportion of wetting agent, if any, used in a fluid.

Experimentation with meniscus contained fluid bodies has found that with a given fluid, there is a minimum volume required to cover a wafer, and there is a maximum volume beyond which the meniscus boundary is broken and fluid overflows the wafer edge. The overflow is wasted fluid. In addition it has been found that said minimum volume can be reduced and continue to be effective by utilizing a means to limit the space or height of the meniscus formed fluid bodies.

The proportion of wetting agent used has a significant effect upon the minimum and maximum volume limits in a meniscus contained body on a given wafer surface. For example, it was found that without any wetting agent in buffered HF etchant and using a 3 ¼ inch diameter wafer with a developed photoresist surface, it took a minimum of 23 cc (cubic centimeters) to fully cover the wafer with a meniscus contained fluid body and that overflow began when the body volume exceeded 29 cc maximum. This provided a 6 cc variation in the volume of fluid in the meniscus contained body for obtaining full surface coverage witout overflow. However, when the space for fluid meniscus formation is reduced the amount of fluid necessary for processing use may be reduced from the normal meniscus formation for a given liquid to a minimum volume short of negative space available for fluid flow.

However, when approximately 1 percent of commerical wetting agent was mixed in the same type of buffered HF etchant, it was found that the minimum volume of etchant in the fluid body was reduced to 12 cc for covering the wafer, and that the maximum volume was 14 cc at which overflow began. Hence, the addition of about 1 percent wetting agent reduced the consumption of etchant in the meniscus contained body by a factor of about 50 percent.

Nevertheless, it was found that the amount of wetting agent cannot be increased indefinitely in order to continuously reduce the volume of fluid in a fluid body. This is because meniscus containment is lost when the wetting agent exceeds a particular value for any given fluid, at which overflow can occur over some edge before the entire wafer surface is covered, which can result in a coverage failure for the given step and a failure in the manufacturing process. That is, failure to cover an area of the wafer with etchant causes failure of the manufacturing process because required etching on the uncovered surface cannot be done.

Accordingly, if wetting agent is to be used, an operable proportion must be chosen for each given operating fluid. An operable proportion of wetting agent maintains sufficient surface tension in the fluid to permit the fluid to form a meniscus contained body over the entire surface of the wafer without ay overflow. The optimum proportion of wetting agent is a proportion slightly below the highest proportion which causes coverage failure. Consequently the amount of process fluid in accordance with this invention is controlled by the space available above the wafer to allow the formation of fluid film or body.

It was also found that in no case was the volume of buffered HF in any meniscus contained fluid body insufficient to perform the required amount of etching at the required rate of etch. Experiments have shown that the amount of etchant used in etching a developed pattern on a 3 ¼ inch wafer is only a small fraction of 1 cc; and in all observed cases, th optimum volume permitted by the wetting agent exceeded the volume requirement for the amount of rate of etch. (The rate of etch of the surface is determined by the strength of the etchant and its temperature, which varies above and below room temperature. Room temperature and elevated temperature are used for different types of oxides to be etched.)

FIG. 1 illustrates an arrangement which can accomodate several manufacturing steps that use minimized meniscus contained fluid bodies on a silicon wafer 1 at a single location in a processing chamber 2. The accommodated steps include photoresist development, etching, etching-end-point-detection, etchant removal, photoresist stripping, washing and drying. Then the wafer can be moved to another location for a next film deposition, photoresist application, and image projection, after which the wafer with the new layer and photoresist may be moved back to the location shown in FIG. 1 where the same process steps may be repeated on the newly deposited layer to form it into the shape determined by the exposed image pattern on the photoresist surface. Over half a dozen different types of layers are normally deposited and etch-formed on a wafer surface during the manufacture of an integrated circuit.

Therefore, the wafer may be periodically returned to the location shown in FIG. 1 to cut the new layer in accordance with the resist image and prepare it for the next layeer required in the manufacture of the semiconductor integrated circuits.

In more detail in FIG. 1, processing chamber 2 receives a semiconducor wafer 1 on a centrifugal vacuum chuck 3 so that wafer 1 is supported horizontally thereon, although the position of the wafer is not limited to a horizontal position in order to accomplish the beneficial effects of this invention.

Figure 4:
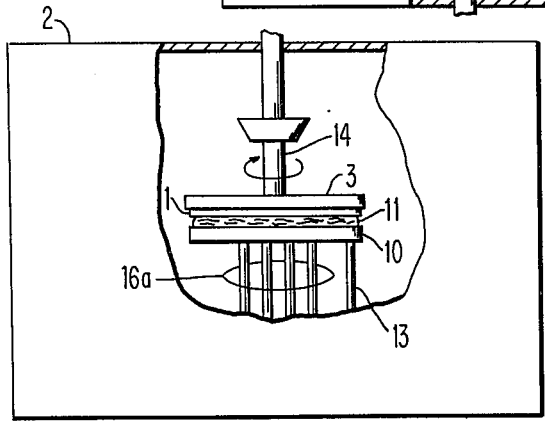
FIG. 4 shows the rotatable spindle and wafer and processing tubes in a reverse or bottom position compared to FIG. 1.
Figure 5A:
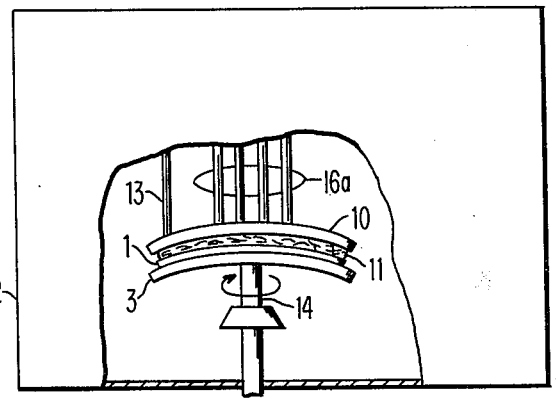
FIGS. 5A and 5B show the rotatable spindle and wafer in an upright position and illustrating a convex and concave shape of the wafer and spindle head.
Figure 5B:
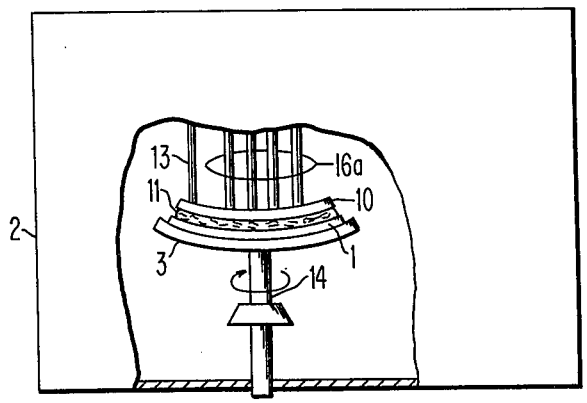

A pressurized air source 4 is communicated to an air motor 5 by a electrcially-controlled air valve switch 6 to controllably rotate shaft 7 and its connected chuck 3. Valve switch 6 can quickly supply or shut off the pressurized air to motor 5 in response to an electrical signal on a lead 8 provided from a programmable controller 9. The air motor 5 starts with very high acceleration. When valve switch 6 is shut off to stop rotation, the wafer 1 is left statically centered on chuck 3, a cover plate 10 or any suitable means is positioned so as to create the limited space 11 which can accomodate the process fluid desired and through which a means for supplying reactant fluid is provided with appropriate means to close said process tubes after the addition of a predetermined amount of fluid. As indicated the space limiting means over the wafer may be of any suitable material or shape depending upon the wafer shape or configuration of the wafer and the processing tool. In FIG. 3 an angular position is illustrated. FIG. 4 illustrates a configuration wherein the process material are supplied from position below the vacuum chuck. FIGS 5A and B illustrate convex and concave shape wafer and chuck holding means as well as the processing fluid limited space area.

Centrifugal chuck 3 is generally shaped to conform to the wafer configuration and is illustrated in FIG. 2, wherein 13 is an appropriate sensor for determining the end of chemical or other action and 14 is the vacuum line which can enter the chuck surface through the rotating shaft 7. Tubes 31 and 38a illustrate the process fluid entrance means.

Then the method of the illustrated embodiment begins by moving a set of nozzles 15a connected to the opening through cover plate 10 or said meniscus space limiting means over wafer 1. Normally the nozzels are located to the right of wafer 1 in FIG. 1, so that drippage from any nozzel cannot fall onto the wafer surface after reaction is complete. The set of nozzels 16a are moved over wafer 1 by applying pressurized air into a cylinder 17 in FIG. 1 by electrically energizing an air switch 18. Air actuated piston 19 is driven by air pressure applied through tube 20, as are connecting rod 21 and a nozzle-actuating block 22, which is fixed to the set of nozzle 16a whenever any nozzle in the set is to pass fluid to the wafer surface. The piston stops at a predetermined position with the nozzle over wafer 1 when piston 19 uncovers cylinder opening 23 which causes the air pressure in the cylinder to drop to a point where piston 19 cannot move further against the bias of spring 24. As soon as the fluid is completely dispensed from any nozzle, air switch 18 is turned off by de-energizing switch 18, and the set of nozzles is moved away from over the wafer 1 under bias of spring 24 as the air pressure in cylinder 17 dissipates through a small cylinder bleeder opening 25.

The nozzle set 16a is rigidly supported with respect to coupling block 26 in a slidable manner through opening 27 in chamber 2. A flexible section of tubing 16b is provided to enable the required movement by the nozzle set 16a and the cover plate space limiting means 10.

While nozzle set 16a is over wafer 1, a metered amount of a commercial photoresist developer is applied via a metering cylinder 28 onto the photoresist surface through nozzles 31a connected to a tube 31. Fluid meter 28 provides the precise quantity needed to form a predetermined meniscus contained fluid body 11 on the photoresist surface of wafer 1 from edge-to-edge without overflow. This quantity of developer has been found to be more than sufficient to develop the ultra-violet exposed image in the photoresist surface. Fluid meter 28 contains a piston driven by a solenoid motor 29. When activated, the piston squeezes a flexiable plastic envelope 30 containing photoresist developer fluid which is forced through tube 31 and nozzle 31a onto the surface of wafer 1. After actuation, the piston returns to its original position under solenoid return spring actuation to thereby expand plastic envelope 30 and draw into it a measured quantity of developer through a unidirectional valve 33 from a tube 34 connected to a photoresist developer source, such as a tank of the developer.

When photoresist developing is completed, the set of nozzle 16a remaining over the wafer 1, valve 35 is actuated to spray rinse fluid, which is deionized water, from nozzle 35a to wash away the loose photoresist material remaining after development is completed. Then motor 5 is actuated to spin off the loose matter and spray. Then, a baking element 37 may be actuated to dry and further harden the newly exposed edges in the ramaining photoresist material.

Motor 5 is now stopped and wafer is again static (no velocity). Then a metered-quantity of etchant, such as buffered hydrofluoric acid (HF) having an optimum proportional amount of wetting agent, is provided to the photoresist developed surface of wafer 1 by metering cylinder 38 to form a meniscus contained etchant fluid body 11 without overflow. This is done in FIG. 1 by actuating through tube 38a and its nozzle to the surface of wafer 1 to form the predetermined volume of meniscus contained fluid body 11. Metering device 38, 39 is the same as metering device 28, 29 previously described.

As soon as body 11 is formed of etchant, the air switch 18 remains activated to cause nozzle 16a with an EEP detector 13 to remain through the limiting cover plate 10 over wafer 1. Then the EEP detector system has its tip in contact with the etchant body 11, and the detector is enabled by energizing a laser 40 to transmit light through fiber optics 41 to the surface of wafer 1 from which it is reflected through fiber optics 42 to a photo transistor or a light detector 43.

Th fiber optics bundles 41 and 42 are flexible to permit lateral movement of the tip 13, which is located in the fluid volume limiting means in contact with said process fluid. The tip of 13 comprises a polycarbonate lens supported by a fluid tight plastic sleeve at the end of fiber bundle 13 to protect the fibers from the etchant; otherwise the etchant would destroy the light passing ability of the ends of the fibers if they were allowed directly contact the etchant, and this would make the EEP detector system inoperable.

The EEP detector 43 receives the light through bundle 42, and it generates a signal proportional to the amount of light reflected from the surface being etched. The output of amplifier 44 is provided on lead 45 to programmable controller 9. When the amplifier signal stops undulating and becomes constant, these conditions indicate the end of etching and controller 9 electrically actuates air switch 6 to quickly start rotation of motor 5 and wafer 1 to rapidly apply centrifugal force to the meniscus contained fluid body 11 which immediately breaks it up and throws it off of wafer 1 onto the inner walls of chamber 2 from which it flows into drain 46 for disposal. Concurrently, outputs are provided on lines 47 and 48 by controller 9 to energize valve 35 to apply rinse fluid onto the upper surface of wafer 1 to cleanse any possible remaining etchant of foreign matter. Wafer 1 may continue spinning under actuation of motor 5 while the rinse fluid is being applied. The etching operation is now completed for the last layer deposited on wafer 1 to which the current photoresist overlay is applied.

The set of nozzle 16a and the EEP detector 43 and cover plate 10 are at this time moved to the right of wafer 1 under bias of spring 24 by discontinuing the signal on air switch 18.

An example of an EEP detector system is published in the IBM Technical Disclosure Bulletin, April 1973, Page 3532, entitled "Etch End-Point Detector" by R. N. Price.

When the etching operation is completed, the existing photoresist matter on the wafer surface must be removed by a stripping operation in preparation for subsequent steps which will deposit the next layer onto wafer 1. The stripping operation is done also by depositing another controlled meniscus contained body 11 of stripping fluid, such as hot sulfuric acid ($H_2SO_4$), by actuating a solenoid 46 which actuates a piston in a metering cylinder 47 to force a required volume of stripping fluid though tube 47a and its nozzles 47d to form a meniscus contained fluid body 11 on the wafer surface in a similar manner to that previously described for the metering of fluids by cylinders 38 and 28. Upon completion of the stripping operation, determined by a time-out in controller 9 when all the remaining resist is loosened or dissolved, motor 5 is energized and the stripping fluid body 11 is instantly removed by centrifugal force in the manner previously described. Rinse fluid is then turned on by controller 9 energizing lines 35a to wash away any remaining contaminants on the top surface of wafer 1, and heating element 37 is turned on to dry the wafer.

The wafer may now be removed from chamber 2 to perform the steps that provide the next layer on wafer 1, after which the wafer may be returned to chamber 2 to repeat all of the above described operations to form the next layer, etc. until manufacturing is completed for the wafer.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A method for static liquid treatment of a surface of a semiconductor wafer with a liquid capable of forming a meniscus on said wafer having a liquid surface parallel to said wafer surface at a given distance from said wafer surface comprising:
    supporting said wafer upon a rotatable means and providing in superimposed proximity thereof a means for limiting the space height distance between said wafer and said limiting means, said space height distance being less than said given distance,
    forcing predetermined volume of fluid between said wafer and distance limiting means so as to form a meniscus of said liquid at the periphery of said wafer, whereby the entire surface of said wafer is covered with said liquid in a meniscus formed body of less dimension than normally formed in the absence of said limiting means,
    statically maintaining said liquid meniscus body on said wafer until reaction betwen said liquid and wafer surface is accomplished as predetermined,
    determining the predetermined completion of said reaction, spinning said wafer to apply centrifugal force to said wafer and liquid body at the time of sensing the predetermined reaction is complete thereby immediately removing the reactant liquid from the wafer.

2. A method for static liquid treatment of semiconductor wafer in accordance with claim 1 wherein said rotatable supporting means comprises a rotatable spindle having a platform thereon and a vacuum chuck means integral therewith for securing said wafer to said platform.

3. A method for static liquid treatment of semiconductor wafer in accordance with claim 1 wherein said liquid is a photosensitive lithographic liquid.

4. A method for static liquid treatment of semiconductor wafer in accordance with claim 1 wherein said wafer contains a photolithic exposed photosensitive pattern thereon and the said liquid is a photoresist developer.

5. A method for static liquid treatment of semiconductor wafer in accordance with claim 1 wherein said wafer contains a developed photoresist pattern and said solution is an etchant.

6. A method for static liquid treatment of semiconductor wafers in accordance with claim 1 wherein said rotatable means is angular from the horizontal.

7. A method for static liquid treatment of semiconductor wafers in accordance with claim 1 wherein said means for limiting the distance between said wafer and said limiting means conforms to the configuration of the wafer.

8. A method for static liquid treatment of semiconductor wafers in accordance with claim 1 wherein said wafer has a concave configuration.

9. A method for static liquid treatment of semiconductor wafers in accordance with claim 1 wherein said wafer has a convex shape.

10. A method for static liquid treatment of semiconductor wafers in accordance with claim 1 wherein said wafer has a given configuration and the configuration of said rotatable means conforms therewith.

11. A method for static liquid treatment of semiconductor wafers in accordance with claim 1 wherein said limiting distance means is movable from any superimposed position respecting said wafer and rotatable means.

12. A method for treatment of a surface of a semiconductor wafer with an etching liquid capable of forming a meniscus on said wafer having a liquid surface parallel to said wafer surface at a given distance from said wafer surface comprising
    supporting said wafer in a fixed position, disposing a plate having a surface juxtaposition with said wafer surface at a distance within said given distance from said wafer surface, applying said etching liquid to said wafer surface unitl said liquid completely fills a volume defined by said wafer surface, said plate surface and meniscus formed between said surfaces at the periphery of said liquid, and spinning said wafer at a given time to remove said etching liquid from said wafer surface by centrifugal force.

13. A method as set forth in claim 12 wherein said liquid is applied to said wafer surface through an operning in said plate.

* * * * *